United States Patent [19]

Glenn

[11] Patent Number: 5,100,808

[45] Date of Patent: Mar. 31, 1992

[54] METHOD OF FABRICATING SOLAR CELL WITH INTEGRATED INTERCONNECT

[75] Inventor: Gregory S. Glenn, Los Angeles, Calif.

[73] Assignee: Spectrolab, Inc., Sylmar, Calif.

[21] Appl. No.: 568,383

[22] Filed: Aug. 15, 1990

[51] Int. Cl.⁵ .................... H01L 31/18; H01L 31/05
[52] U.S. Cl. ........................ 437/2; 136/244; 136/256
[58] Field of Search ............ 136/244, 256; 437/2–5, 437/180, 183, 189

[56] References Cited

U.S. PATENT DOCUMENTS

| 3,411,952 | 11/1968 | Ross et al. | 136/244 |
| 5,045,481 | 9/1991 | Schilling et al. | 437/2 |

FOREIGN PATENT DOCUMENTS

| 3511082 | 10/1986 | Fed. Rep. of Germany | 136/256 |
| 56-94785 | 7/1981 | Japan | 136/244 |
| 61-53950 | 4/1986 | Japan | 136/256 |
| 61-292380 | 12/1986 | Japan | 136/256 |
| 62-16579 | 1/1987 | Japan | 136/244 |

*Primary Examiner*—Aaron Weisstuch
*Attorney, Agent, or Firm*—Terje Gudmestad; W. K. Denson-Low

[57] ABSTRACT

A pattern of current collection gridlines (24) is formed on a surface (20) of a photovoltaic wafer (12). An ohmic contact strip (28) is formed adjacent to an edge (12c) of the wafer (12) in electrical interconnection with the gridlines (24). Interconnect tabs (30) are integrally formed with the gridlines (24) and contact strip (28), extending away from the contact strip (28) external of the edge (12c) for series or parallel interconnection with other solar cells. The interconnect tabs (30) may have a stress reflief configuration, including a non-planar bend or loop. The wafer (12) initially has a first portion (12a) and a second portion (12b). A barrier layer (50) of photoresist or the like is formed on the second portion (12b). The grid (24) and contact strip (28) are formed on the first portion (12a) simultaneously with forming the interconnect tabs (30) over the barrier layer (50) on the second portion (12b) using photolithography and metal deposition. The barrier layer (50) is dissolved away, and the second portion (12b) is broken away from the first portion (12a), leaving the interconnect tabs (30) extending from the contact strip (28) external of the remaining first portion (12a) of the wafer (12).

6 Claims, 3 Drawing Sheets

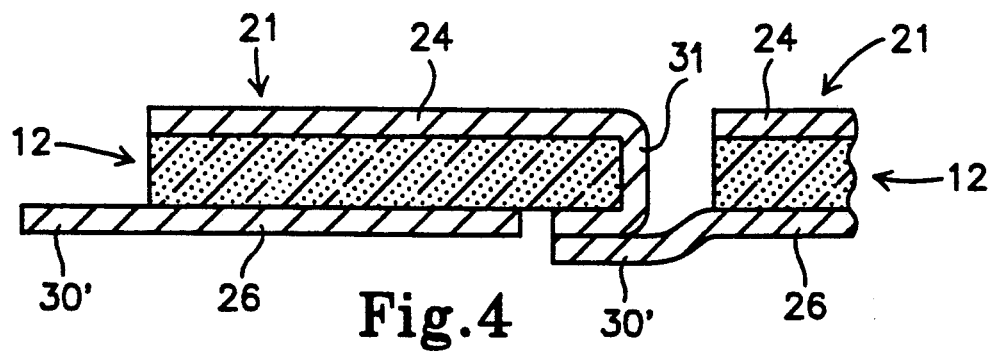
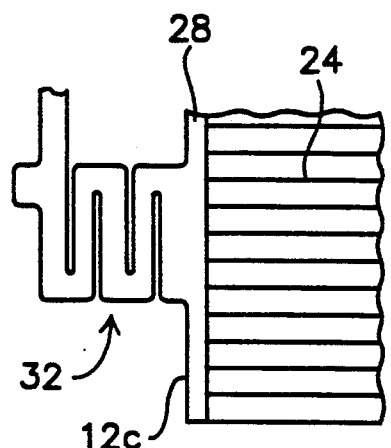
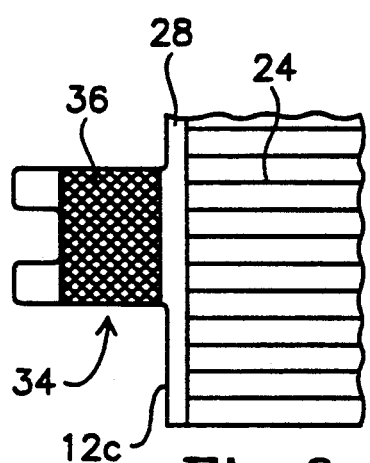
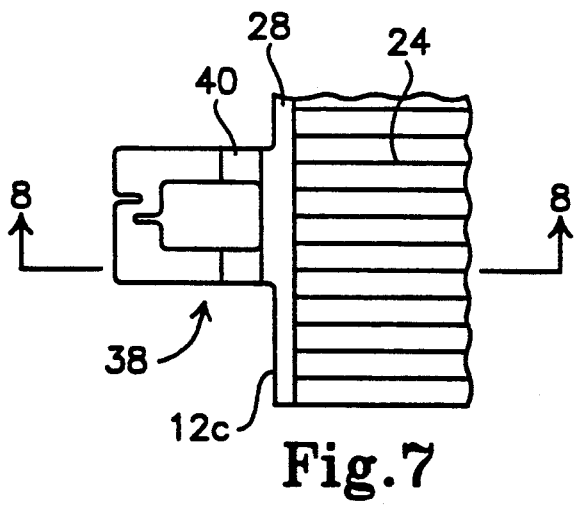
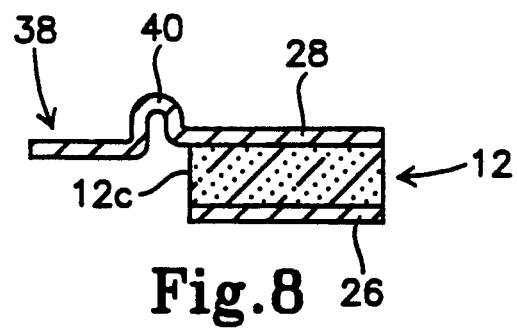
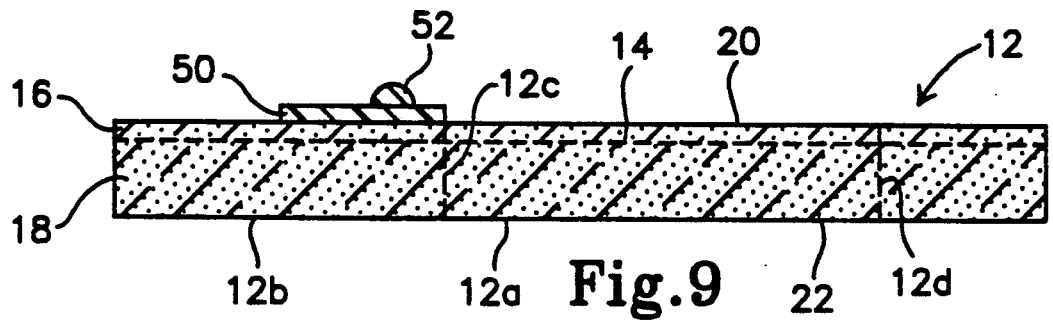

METHOD OF FABRICATING SOLAR CELL WITH INTEGRATED INTERCONNECT

BACKGROUND OF THE INVENTION

1. Field of the Invention

The present invention relates to the fabrication of a photovoltaic solar cell having integrally formed interconnects for series or parallel connection with other solar cells.

2. Description of the Related Art

Arrays which may include hundreds or thousands of solar cells are used to provide electrical power for a variety of applications. Solar cell interconnection tabs, or interconnects, conduct the electrical current from one cell to another in series strings, and may also interconnect cells in parallel groups. A detailed presentation of electrical interconnections for solar cells is found in a book entitled "SOLAR CELL ARRAY DESIGN HANDBOOK", Volume 1, Jet Propulsion Laboratory, California Institute of Technology, Pasadena, California, October 1976, pp. 5.0-1 to 5.3-13.

Interconnects are conventionally manufactured by punching or etching metal strips or sheets to the desired configuration. They are traditionally less than 0.05 mm thick, and are attached to the solar cells using an extremely time consuming manual soldering or welding process. Alternatively, an elaborate and expensive automated process may be used. In addition to being highly labor intensive, welding or soldering the delicate interconnects to the solar cells is a high risk procedure, which can result in frequent breakage of the expensive solar cells and a high rate of attrition in the fabrication process.

SUMMARY OF THE INVENTION

A solar cell includes a flat photovoltaic wafer made from n-type or p-type crystalline semiconductor material in which a thin surface layer of the opposite semiconductor type is formed by diffusion. The interface between the diffused surface layer and the main or bulk region of the wafer defines a semiconductor junction. A current collector grid metallization is formed on a surface of the wafer which is designed to receive light, such as a silicon cell n-contact, and an additional metal layer is formed on the opposite surface thereof. An ohmic contact strip or metallization is formed adjacent to an edge of the wafer on the same surface as the gridlines in electrical interconnection therewith. In accordance with the present invention, the ohmic metallization extends beyond the edge of the wafer in the form of interconnects which enable series or parallel connection of the solar cell to other solar cells in a circuit or array. The interconnects may be embodied as tabs having any desired shape, such as planar stress relief configurations including mesh and "lazy-S", and non-planar bends or loops. The metallization type and thickness may be varied for added strength, atomic oxygen resistance, or any other requirements for a specific application.

Since the interconnects are fabricated integrally with the ohmic metallization of the solar cell, the cost and labor required for separately manufacturing and handling as many as tens of thousands of interconnects per solar array are eliminated, as well as the high attrition rate associated with attachment of the interconnects to the cells. Product throughput and yield are substantially improved through elimination of process steps required for separately manufactured interconnects, including cleaning, classification, attachment, and inspection.

More specifically, a pattern of current collection gridlines is formed on a surface of a photovoltaic wafer. An ohmic contact strip is formed adjacent to an edge of the wafer in electrical interconnection with the gridlines. Interconnect tabs are integrally formed with the gridlines and ohmic contact strip, extending away from the contact strip external of the edge for series or parallel interconnection with other solar cells. The wafer initially has a first portion and a second portion. A barrier layer of photoresist or the like is formed on the second portion. The gridlines and ohmic contact strip are formed on the first portion simultaneously with forming the interconnect tabs over the barrier layer on the second portion using photolithography and metal deposition. The barrier layer is dissolved away, and the second portion is cut and broken away from the first portion, leaving the interconnect tabs extending from the contact strip external of the remaining first portion of the wafer.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 4 is similar to FIG. 3, but illustrates another alternative embodiment of the invention;

FIGS. 5, 6 and 7 are fragmentary plan views illustrating alternative interconnect tabs embodying the present invention;

FIG. 8 is a sectional view taken on a line 8—8 of FIG. 7; and

FIGS. 9 to 14 are sectional views illustrating a method of fabricating a solar cell in accordance with the present invention.

DETAILED DESCRIPTION OF THE INVENTION

Figure 1:
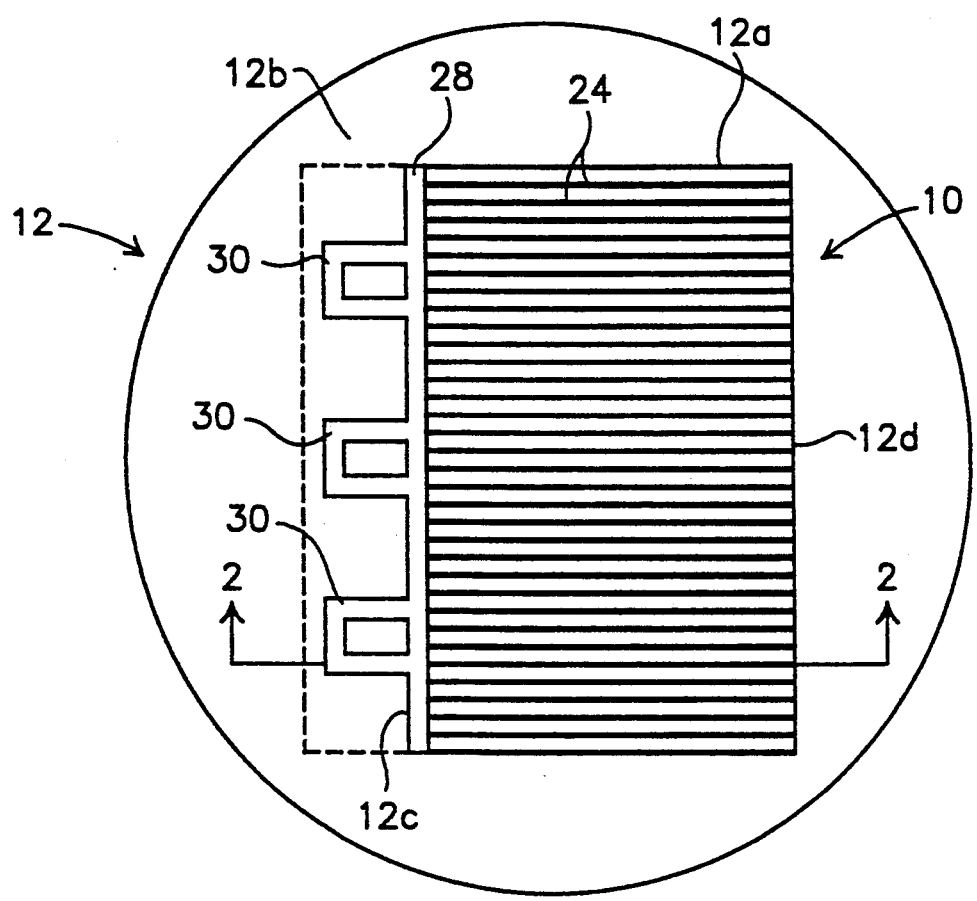
FIG. 1 is a plan view of a solar cell fabricated in accordance with a method embodying the present invention.
Figure 2:
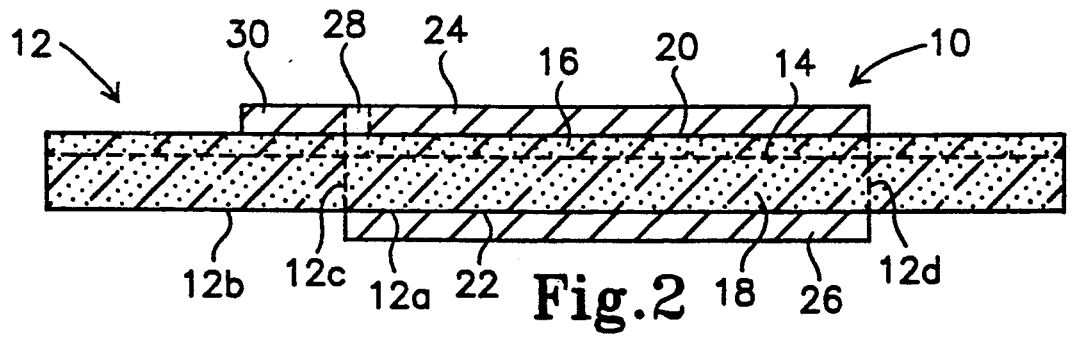
FIG. 2 is a sectional view taken on a line 2—2 of FIG. 1.

Referring to FIGS. 1 and 2 of the drawing, a solar cell embodying the present invention is generally designated as 10, and is fabricated from a photovoltaic member in the form of a wafer 12 made of a semiconductive material such as silicon. Initially, the solar cell 10 may be processed together with a quantity of similar cells as a portion of a single wafer 12. Each cell 10 on the wafer 12 has a first portion 12a, and a second portion 12b which is illustrated in broken line. An edge 12c is defined between the first and second portions 12a and 12b. The wafer 12 further has an edge 12d opposite the edge 12c. As viewed in FIG. 2, the wafer 12 is fabricated into a photovoltaic structure using a diffusion process or the like so as to have a semiconductor junction 14 defined between differently doped regions 16 and 18. Irradiation of light on a first surface 20 of the wafer 12 causes liberation of charge carriers including electrons and holes in the region of the junction 14, which migrate toward the first surface 20 or a second surface 22 depending on their polarity. An electrically conductive pattern of current collection gridlines 24 is formed on the surface 20 for collection of charge carriers which migrate thereto. A similar pattern of gridlines or a continuous electrically conductive ohmic contact layer 26 is formed on the second surface 22 for collection of charge carriers of the opposite type.

The gridlines 24 are formed as a metallization having a pattern, line thickness, and spacing selected to provide an optimal compromise between transmission of incident light into the wafer 12 and electrical current collection efficiency. The gridlines 24 are integrally formed in electrical interconnection with an ohmic contact strip 28 on the first portion 12a of the wafer 12 adjacent to the edge 12c. In accordance with an important feature of the present invention, electrically conductive interconnects which are illustrated as tabs 30 are formed integrally with the gridlines 24 and contact strip 28, and extend from the contact strip 28 laterally away from or external of the edge 12c. In the finished solar cell 10, the second portion 12b of the wafer 12 is removed by rearside scribing and snapping, so that the interconnect tabs 30 extend from the wafer 12 in a cantilever manner for series or parallel interconnection of the cell 10 to adjacent solar cells in an array (not shown).

Figure 3:
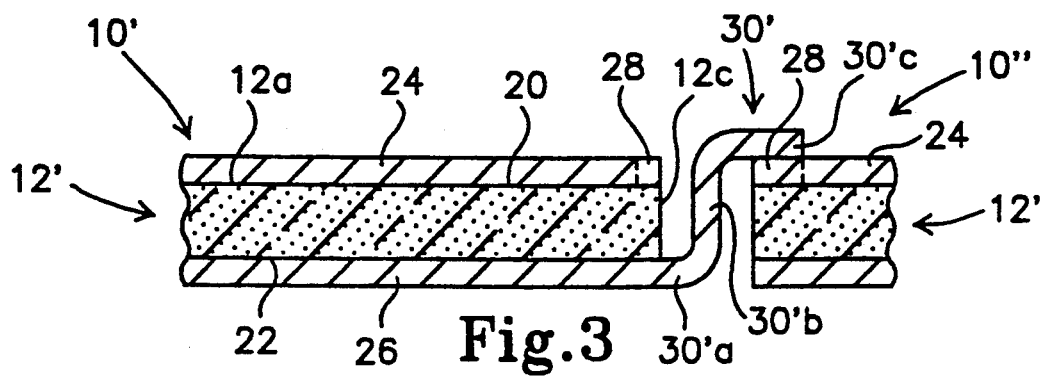
FIG. 3 is a sectional view illustrating an alternative embodiment of the present invention.

FIG. 3 illustrates another embodiment of the invention in which like elements are designated by the same reference numerals, and similar but modified elements are designated by the same reference numerals primed. In FIG. 3, a solar cell 10' includes interconnects or tabs 30' which are adapted for series connection of the cell 10' to an adjacent solar cell 10''. Each tab 30' includes a first portion 30'a which extends from the contact layer 26 on the second surface 22 of the wafer 12' laterally away from the edge 12c, a second portion 30'b which extends from the first portion 30'a upwardly and generally parallel to the edge 12c, and a third portion 30'c which extends from the second portion 30'b away from and in alignment with the contact strip 28. In this case, the second portion (not shown) of the wafer 12 on which the tabs 30' are formed is broken away from the first portion 12a from the frontside, rather than from the backside as in FIGS. 1 and 2 The third portion 30'c of each tab 30' is soldered, welded, or otherwise electrically connected to the ohmic 28 of the adjacent solar cell 10''.

FIG. 4 illustrates a "wraparound" configuration which is similar to FIG. 3 except that interconnection is on the same side of the cells. Solar cells 21 each include a photovoltaic wafer 12 having gridlines 24 and a contact layer 26 as described above. In addition, each cell 21 includes wraparound contact 31 extending from the gridlines 24 on the upper surface, and interconnect tabs 30' extending from the contact layer 26 on the lower surface. The wraparound contact 31 is deposited through evaporation or the like around and under the right insulated edge portion of the wafer 12 as viewed in FIG. 4, and makes contact with the tabs 30' of the adjacent cell 21 to form a series connection. The contact layer 26 is omitted in the right edge portion of the lower surface around which the tabs 30 extend to prevent shorting of the cells 21. In addition, the wraparound contact 31 is deposited on an electrical insulator such as $SiO_2$.

Although the interconnects are illustrated as being in the form of tabs 30 in FIGS. 1 and 2, they may have a wide variety of shapes within the scope of the invention, such as elongated bars (not shown). Alternative configurations of interconnect tabs provided with strain relief configurations are shown in FIGS. 5 to 8. An interconnect tab 32 shown in FIG. 5 has a planar or "in-plane" boustrophedonic or "lazy-S" shape. An interconnect tab 34 shown in FIG. 6 includes a planar grid or mesh 36. An interconnect tab 38 shown in FIGS. 7 and 8 is formed with a non-planar or "out-of-plane" bend 40 which first extends parallel to the edge 12c or the wafer 12.

A preferred method of fabricating the solar cell 10 is illustrated in FIGS. 9 to 14. In FIG. 9, the wafer 12 is made of, for example, 200 micron thick silicon. A planar release or barrier layer 50 is formed on the second portion 12b. The planar layer 50 is preferably formed of standard photoresist to a thickness of 0.5 to 3 microns. In an application where interconnect tabs including non-planar stress relief bends such as illustrated in FIGS. 7 and 8 are desired, another layer 52 of photoresist may be formed on the planar layer 50 in a pattern corresponding to the shape of the desired bends. Although not illustrated in the drawing, the barrier layer 50 may be initially formed of photoresist on the entire first surface 20 of the wafer 12 using a soft bake process at approximately 90° C., exposed with ultraviolet light through a mask, and developed to remove the photoresist from the first portion 12a. The wafer 12 is then baked at a high temperature of approximately 135° C. to drive the sensitizer out of the photoresist and make it resistant to further processing with developer.

The carrier layer 50 need not be formed of photoresist, but may include any material which allows deposition of metallization thereon, and can be subsequently released or removed from the metallization.

Figure 10:
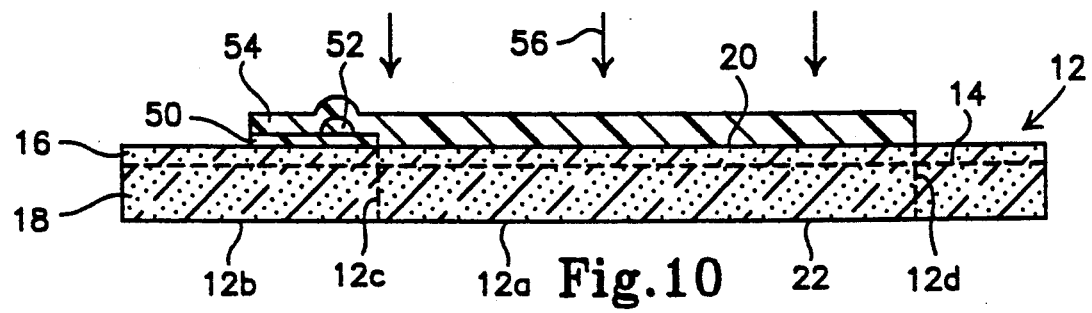
Figure 11:
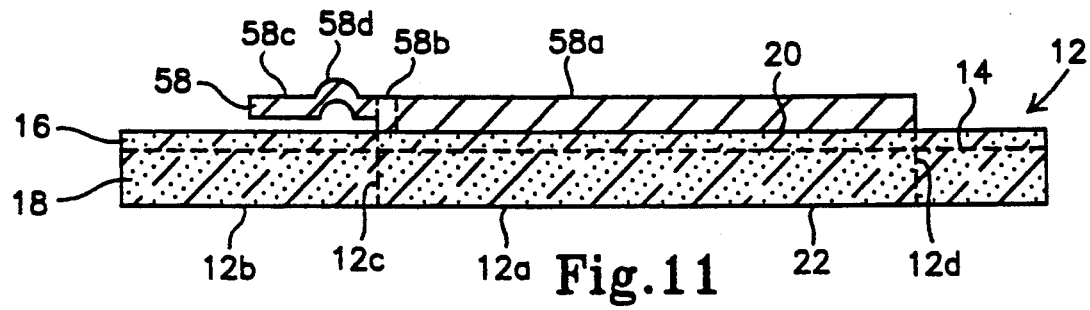

In FIG. 10, a second layer 54 of standard photoresist is formed over the first and second portions 12a and 12b respectively of the wafer 12 to a thickness of approximately 6 to 7 microns using the soft bake process at approximately 90° C., exposed through a mask (not shown), and developed to provide an integral pattern which defines the grid, ohmic contact strip, and interconnects. Metallization is deposited by evaporation or any other applicable process through the openings (not shown) in the photoresist pattern as symbolically indicated by arrows 56. In FIG. 11, the photoresist 50, 52, and 54 is lifted off or dissolved away, along with the metal deposited on top of the photoresist, to leave a metallization pattern 58 on the wafer 12 having a grid portion 58a, an ohmic contact strip portion 58b, and an interconnect portion 58c. The section line through which FIG. 11 is taken is shifted into the page with respect to FIG. 10. FIG. 10 shows a section taken through a solid strip of the photoresist 54, while FIG. 11 shows a section taken through a void between successive strips of photoresist 54 that has been filled by metal 58. It will be noted that the interconnect portion 58c is undercut since the photoresist 50 (and optionally 52) constituting the barrier or release layer were removed. Also, the interconnect portion 58c is formed with an out-of-plane bend 58d corresponding to the shape of the second photoresist layer 52. It will be understood that the bend 58d may be formed mechanically if desired after fabrication of the solar cell including the interconnect tabs has been completed.

Although the metallization 58 may include a single layer of material, it preferably includes several sub-layers, such as an 0.7 kÅ thick layer of titanium, a 1.0 kÅ thick layer of palladium, and a 55 kÅ layer of silver for silicon wafers.

Figure 12:
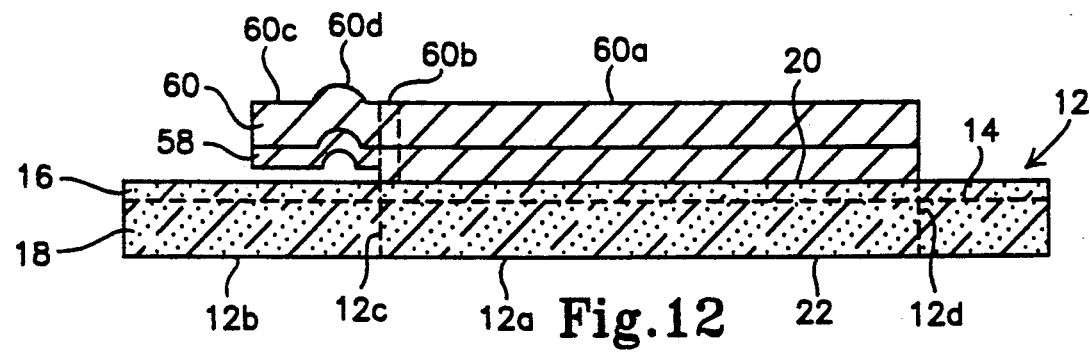
Figure 13:
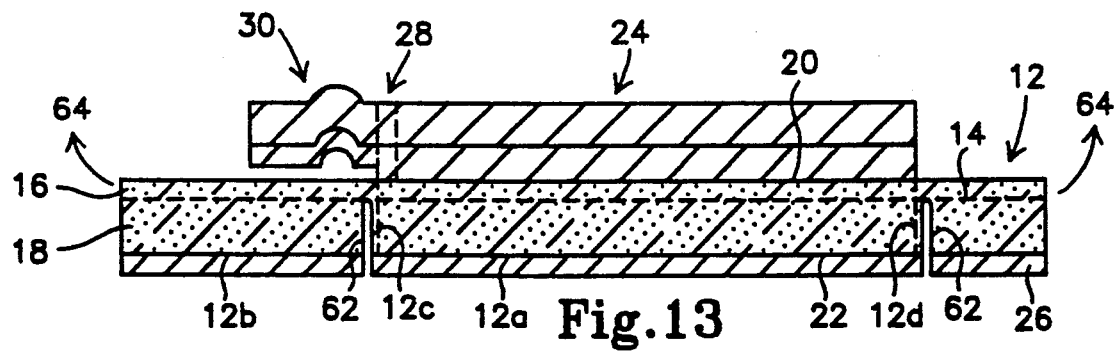
Figure 14:
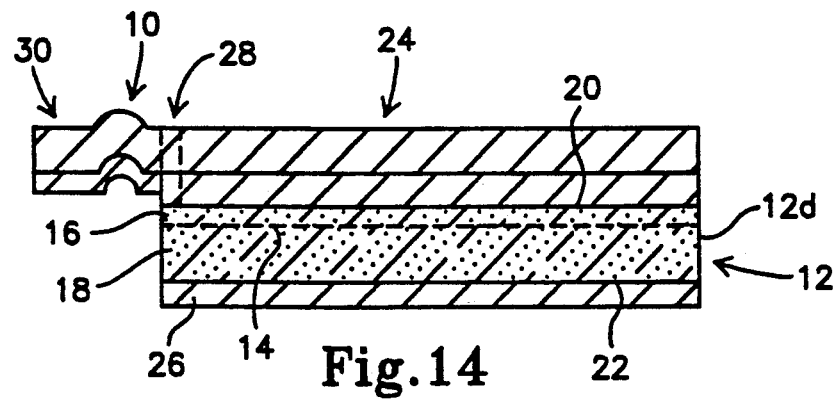

If a metallization thickness greater than that formed by deposition as illustrated in FIGS. 10 and 11 is required, a second metallization layer 60 may be formed on the first metallization layer 58 by electroplating or any other suitable process (FIGS. 12 to 14). The second metallization layer 60 includes a grid portion 60a, a contact strip portion 60b, and an interconnect portion 60c having a bend 60d. The metallization layers 58 and 60 in combination form the grid 24, contact strip 28, and interconnects 30 (FIGS. 13 and 14).

Typically, the second metallization layer 60 will be formed of silver to a total thickness of 25 microns. If it is desired that the thickness of the grid 24 be limited to the thickness of the first metallization layer 58, a solvent removable conformal coating may be applied to the grid 24 prior to electroplating so that only the interconnects 30 and contact strip 28 will be plated. The conformal coating is removed after the electroplating step. Additionally, the contact layer 26 is formed on the second surface 22 as illustrated in FIG. 13.

As illustrated in FIG. 13, cuts 62 are made along the lines 12c and 12d in the contact layer 26 and second surface 22 of the wafer 12 using a laser, diamond scribe, etching, or the like. The second portion 12b and the right side portion of the wafer 12 are bent upwardly as illustrated by the arrows 64 until they snap or break away from the first portion 12a t form the completed solar cell 10 as illustrated in FIG. 14. The rear metallization is evaporated before cutting from the wafer 12.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

I claim:

1. A method of fabricating a solar cell, comprising the steps
    (a) providing a photovoltaic member having a first portion including a first surface and a second portion integral with the first portion and including a second surface which extends from said first surface;
    (b) forming a releasable barrier layer on the second surface;
    (c) integrally forming a resist layer including contact and interconnect pattern portions for ohmic contact means and interconnect means to be deposited on said surfaces and the barrier layer;
    (d) integrally depositing electrically conductive material on said surfaces and the barrier layer through the contact and interconnect pattern portions of the resist layer respectively;
    (e) removing the barrier layer and the resist layer; and
    (f) removing the second portion from the first portion and the interconnect means.

2. A method in claim 1, further comprising the step, performed after step (e), of:
    (i) electroplating a second electrically conductive material on said electrically conductive material.

3. A method as in claim 1, in which step (b) comprises forming the barrier layer as a resist layer.

4. A method in claim 3, in which step (e) comprises dissolving away said resist layers.

5. A method as in claim 1, in which step (b) comprises forming the barrier layer with a non-planar shape.

6. A method in claim 5, in which step (b) comprises the substeps of:
    (i) forming the barrier layer as including a planar first resist layer; and
    (j) forming a second resist layer having a pattern corresponding to the non-planar shape on the first resist layer.

* * * * *